United States Patent
Yan et al.

[11] Patent Number: 5,958,629
[45] Date of Patent: Sep. 28, 1999

[54] USING THIN FILMS AS ETCH STOP IN EUV MASK FABRICATION PROCESS

[75] Inventors: Pei-Yang Yan, Saratoga; Guojing Zhang, Sunnyvale; Joseph Langston, Los Altos, all of Calif.

[73] Assignee: Intel Corporation, Santa Clara, Calif.

[21] Appl. No.: 08/995,949

[22] Filed: Dec. 22, 1997

[51] Int. Cl.$^6$ .................................................. G03F 9/00
[52] U.S. Cl. ................................................. 430/5; 430/323
[58] Field of Search .............................. 430/5, 322, 323, 430/324

[56] References Cited

U.S. PATENT DOCUMENTS 5,795,684  4/1996  Troccolo ...................................... 430/5

Primary Examiner—S. Rosasco
Attorney, Agent, or Firm—Naomi Obinata

[57] ABSTRACT

A silicon-substrate based reflective photolithographic mask fabrication technique is described. The process begins with a multilayer, resonant reflecting substrate. A thin layer of silicon dioxide or other material capable of acting as an etch stop layer is deposited thereon. Then, a transmissive layer is deposited on the thin layer of etch stop layer. The transmissive layer is substantially transmissive to the wavelength of light used in the photolithography as well as capable of being selectively etched relative to the underlying etch stop layer. Then, the transmissive layer is etched to open preselected, absorptive areas. An absorptive layer is then deposited thereon. The absorptive layer is substantially absorptive to the wavelength of light used as well as capable of completely filling the opened areas of the transmissive layer. The absorptive layer is then planarized, and a thin protective cap is deposited thereon.

18 Claims, 3 Drawing Sheets

USING THIN FILMS AS ETCH STOP IN EUV MASK FABRICATION PROCESS

FIELD OF THE INVENTION

This invention is related to the field of fabricating photolithographic masks for semiconductor processing.

RELATED ART

The step that defines line widths in semiconductor processing is photolithography. In photolithography, a semiconductor wafer is placed within a photolithography exposure tool. A mask containing the desired pattern is placed over the wafer. Light from a light source is focused through a series of focusing lenses and then transmitted through the mask. The image of the mask may be reduced through reducing lenses, and then the image is shone onto photoresist covering the wafer. A pattern is thereby transferred from the mask to the semiconductor wafer.

As line widths become ever smaller, there is an increased need for precision and cleanliness in the mask making process. Any angles off from the vertical in sidewalls of mask structures, or intrusions of material or contamination on the mask can distort the image transferred to the semiconductor wafer. Improved mask fabrication techniques are developed to reduce pattern defects in the mask. One technique for addressing defects following fabrication steps is defect repair. In defect repair, an ion beam, usually made of gallium, is applied to the defective area to remove the defect, in other words, "repair". Where the defect is due to contamination or intruding material into a pattern area that is supposed to be open, the defect is literally removed. Defect repair in itself carries its own technical issues, however, in that the repair usually leaves a "stain", that is, localized damage and in some cases implanted gallium in the substrate as a result of the high energy ion beam impinging on the mask.

A mask making technique that was developed to accomodate defect repair such that stains remaining from defect repair did not negatively impact imaging during mask use was disclosed in Troccolo, "Novel Photolithography Mask and Method of Fabrication", U.S. Ser. No. 08/628,184. In that technique, the mask is fabricated on a substrate by first coating the substrate with a material that is transmissive to the light source for the photolithography. A trench, that extends partially through but not the entire thickness of the transmissive material is formed in the substrate. The trench is filled with an absorber material. The top surface of the mask is then planarized to remove any excess absorber material on the top surface and to remove contamination or contamination-attracting roughness.

The trench in the above-described mask making technique is formed using plasma etching. In plasma etching, the substrate is placed within a vacuum chamber. At subatmospheric pressure, reactive gases are flowed into the chamber and the gases are ignited into a plasma by applying an electric field. Usually the substrate will be held on an electrode to draw ionized gas particles to the substrate. The combination of ion bombardment and chemical reactions from the plasma cause film on the substrate to be removed, or etched. One issue that arises when a trench is being plasma etched is that the bottom of the trench is rounded. Generally, instead of having a square shape, the bottom of the trench is slightly rounded rather than flat, and the bottom edges may be rounded rather than squared.

The problem with not having a square shape to the bottom of the trench is evident when the final mask is in use. As stated above, the mask is built by filling the plasma etched trenches with absorber material and then planarizing. The trenches define the shape of the absorber material on the mask. If the bottom of the trenches is squared, the absorber material will be squared. If the bottom of the trenches is rounded, the absorber material will be rounded at the bottom. The shape of the absorber material influences the image exposed on a semiconductor wafer when a mask is in use. A squared absorber material leads to clean, well-defined patterns. A rounded absorber material can cause blurred or otherwise inaccurately dimensioned pattern edges, an undesirable outcome in photolithography.

SUMMARY

The invention pertains to a structure of a photolithographic mask and a method of formation. The structure of the mask includes a mask substrate, a transmissive etch stop layer which is directly on the mask substrate, and absorber portions on the etch stop layer. The method includes starting with a mask substrate, and forming a substantially transmissive etch stop layer on the mask substrate. Then, etchable material is formed on the etch stop layer. Then, trenches in the etchable material are etched through the thickness of the etchable material selectively relative to the etch stop layer.

DESCRIPTION OF THE PREFERRED EMBODIMENTS

The present invention is directed to a mask making technique for obtaining a controlled etch of a transmissive material layer and for achieving a substantially vertical etch profile with a squared bottom. While not limited to any particular photolithography wavelength, the invention is useful in Extreme Ultra Violet Lithography ("EUVL") and as such, the described embodiments are for an EUVL mask. EUVL is photolithography that is usually conducted at wavelengths of approximately 5 to 25 nanometers. An EUVL photolithography system includes a light source, a reflective mask and a series of mirrors for reflecting and focusing the image from the reflective mask. The image from the mask is printed on a photoresist-covered substrate, usually a silicon wafer.

The basic invention takes advantage of the transmissive properties of a material to make it useful as an etch stop. A material deposited over a mask surface can function as an etch profile controller while not substantially impairing the reflectivity or transmissivity of the underlying mask substrate, so long as the material is transmissive. Having an etch profile controller or etch stop, as part of the mask is critical for protecting the underlying mask surface while ensuring that etched patterns in the material above the etch stop are clean and substantially vertical, making substantially 90-degree corners at the bottom of the etched lines, where etched material and underlying substrate abut. The general structure of the invention includes a mask substrate, a layer of material having the property of being transmissive and serving as an etch stop, and a mask structure thereon. The mask structure may be planar where absorber portions are held within trenches formed in a structural layer, or the mask structure may be non-planar where absorber structures stand over the etch stop material. The mask may be a reflective or transmissive mask. If there is a structural layer, then the structural layer is a material that can be etched to create trenches into which absorber portions are deposited. The structural layer is transmissive to the wavelength of light to be used if the structural layer is to remain on the mask. Of course, the mask can be fabricated so that the structural layer is used only for creating absorber portions and then selectively removed. The mask can also be fabricated without a structural layer, where an absorber material is deposited over the etch stop and the absorber material is etched to create a pattern.

The preferred embodiment described below is that of a reflective and planar mask for EUVL. This is done to aid in the understanding of how the invention fits into an overall mask fabricating technique only; the invention should not be construed to be limited to a reflective mask, a planar mask, or to EUVL wavelengths. The details of fabricating the mask are described below in reference to the figures.

Figure 1:
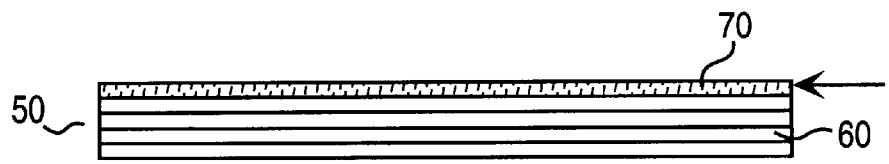
FIG. 1 represents a cross-sectional view of a starting mask substrate, containing a reflective surface and an etch stop material.

FIG. 1 is a representation of a cross-section of a starting reflective mask substrate 50. Mask substrate 50 itself includes reflector portion 60 over an underlying mask blank (not shown). The mask blank may be made of any material that can handle subsequent fabrication processes; preferably, the mask blank is a silicon wafer. Reflector portion 60 consists preferably of multiple layers of alternating reflecting material and transmissive material, to create a resonant reflectance effect. A number of different combinations of reflective and transmissive materials can be used, the preferred embodiment is molybdenum and silicon each at about 20 to 120 angstroms in thickness, to create a reflector thickness of about 500 to 5000 angstroms.

Directly over reflector portion 60, a thin layer of etch stop material 70 is formed. In this embodiment etch stop material 70 is silicon dioxide. The material can be any material that transmits to-be-used light wavelengths while at the same time serving as an etch stop material, that is, a material that selectively does not etch when the layer above is being etched. Etch stop material 70 is preferably formed using physical vapor deposition or chemical vapor deposition, at a temperature selected to avoid flowing or other modification to the underlying reflector 60 structure.

Figure 2:
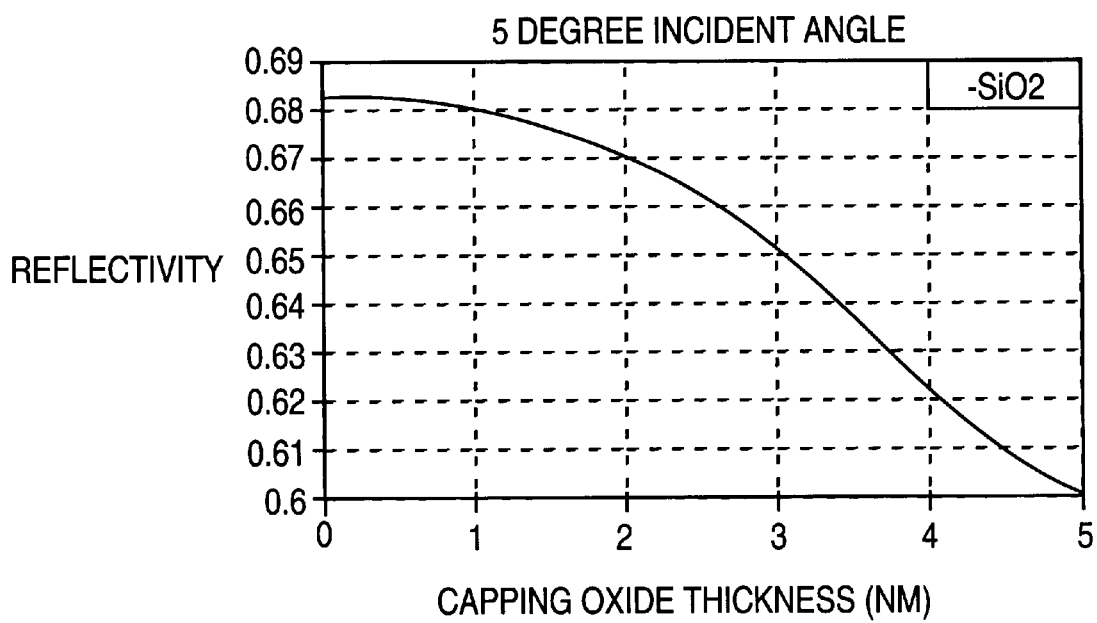
FIG. 2 represents a graphical depiction of reflectivity of a mask surface as a function of etch stop material thickness, where the etch stop material is silicon dioxide.

FIG. 2 illustrates a mechanism for determining the appropriate thickness of etch stop material 70 (FIG. 1). In the case of silicon dioxide, a chart is plotted to show the relationship between silicon dioxide thickness and underlying reflector reflectivity at EUVL wavelengths, assuming an incident light beam angle of 5 degrees. The thicker the silicon dioxide, the less reflectivity. Preferably, a thickness of about 2 nanometers is used for etch stop material 70 if it is silicon dioxide. A thin layer of silicon dioxide can be formed by oxidation if there is an underlayer of silicon material.

Figure 3:
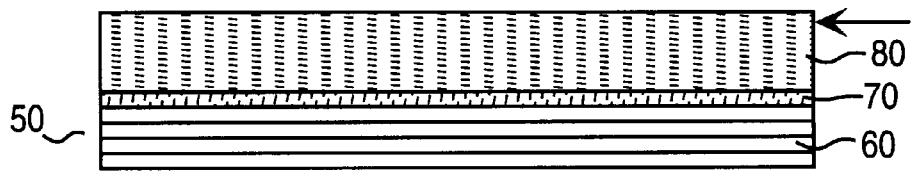
FIG. 3 represents a cross-sectional view of the mask substrate of FIG. I containing a layer of structural material.

FIG. 3 represents a cross-sectional view of the step following formation of etch stop layer 70, which is formation of a structural layer 80. In this embodiment structural layer 80 is amorphous silicon formed from physical vapor deposition or chemical vapor deposition. The material for structure layer 80 is chosen for properties of being selectively etchable relative to etch stop layer 70. If etch stop layer 70 is silicon dioxide, structure layer 80 is appropriately amorphous silicon. Another advantage to using amorphous silicon in the case of EUVL is that it is substantially transmissive to EUVL wavelengths at relatively large thicknesses, on the order of 1000 to 1500 angstroms. With a substantially transmissive structure layer 80, structure layer 80 can remain as part of the overall mask structure and not be removed. If a non-transmissive material is used, then the material would need to be etchable so that it can be selectively removed from mask 50.

Figure 4:
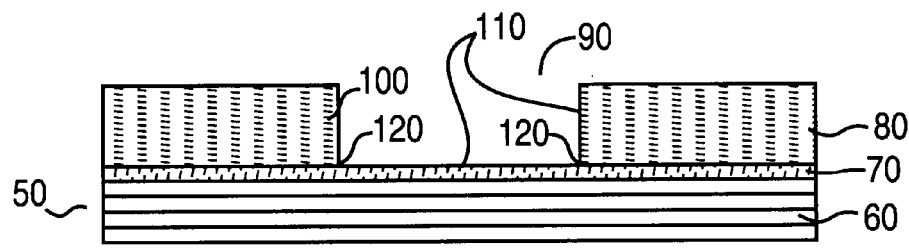
FIG. 4 represents a cross-sectional view of the mask substrate of FIG. 3 after the structural material has been etched.

FIG. 4 represents a cross-sectional view of the step following formation of structure layer 80, which is to etch a trench 90 into structure layer 80. Trench 90 is etched much like etching is done for semiconductor wafers; that is, a layer of photoresist is patterned and the pattern is replicated into the underlying structure layer 80. Trench 90 is preferably formed by plasma etching, using the advantage of plasma rather than wet etches for forming straight, substantially vertical sidewalls 100. Trench 90 is etched through the entire thickness of structure layer 80 to etch stop layer 70. During etch, when the plasma etch reaches etch stop layer 70, the plasma etch goes into "overetch" mode, that is, where the plasma no longer digs the trench into structure layer 80 but rather concentrates on the base of trench 90 to remove residue and any rounding on the bottom edges. The result of overetch is to have a substantially clean trench bottom 110 and more importantly for this invention, corners 120 on the edges of trench bottom 110. Note that overetch is made possible only by selecting a material for etch stop layer 70 that tends not to etch in the same conditions used for etching structure layer 80.

Figure 5:
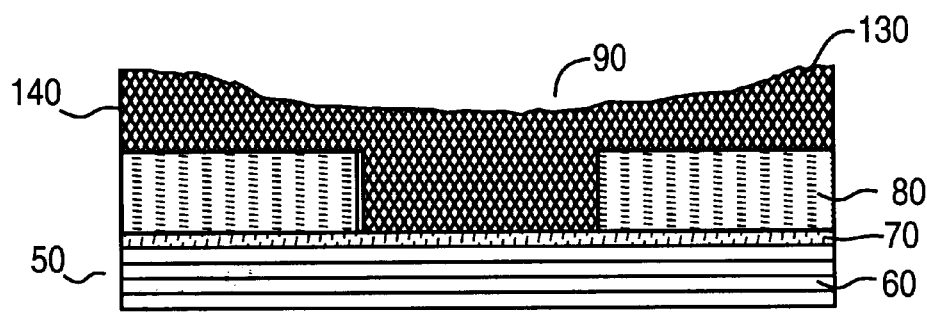
FIG. 5 represents a cross-sectional view of the mask substrate of FIG. 4 after an absorber material has been deposited onto the mask surface.

FIG. 5 represents a cross-sectional view of the step following formation of trench 90, which is to deposit absorber material 130 over the surface of the mask. Absorber material 130 may be chromium, tantalum, titanium, tungsten or aluminum or other material, selected for its characteristics of being absorptive to the wavelength of light to be used and for its ease of use in mask fabrication. Absorber material 130 is preferably deposited in a "blanket" manner using physical vapor deposition or chemical vapor deposition, that is, deposited to cover all surfaces including the inside of trench 90 and the top surface 140 of structure layer 80.

Figure 6:
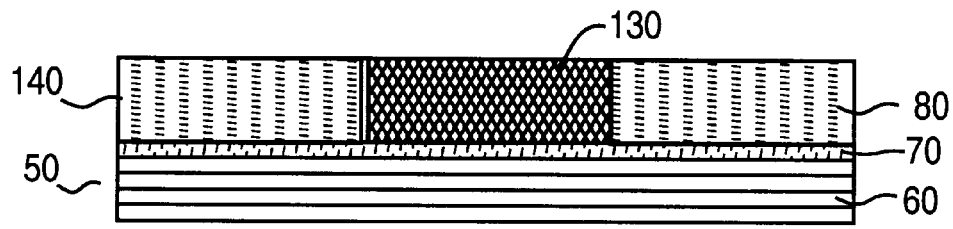
FIG. 6 represents a cross-sectional view of the mask substrate of FIG. 5 after the mask surface has been planarized.

FIG. 6 represents a cross-sectional view of the step following deposition of absorber material 130, which is to planarize the surface of the mask. Using a planarization technique such as chemical mechanical polish or plasma or wet etch, absorber material 130 is removed from top surface 140 of structure layer 80 to create an overall planar effect.

Figure 7:
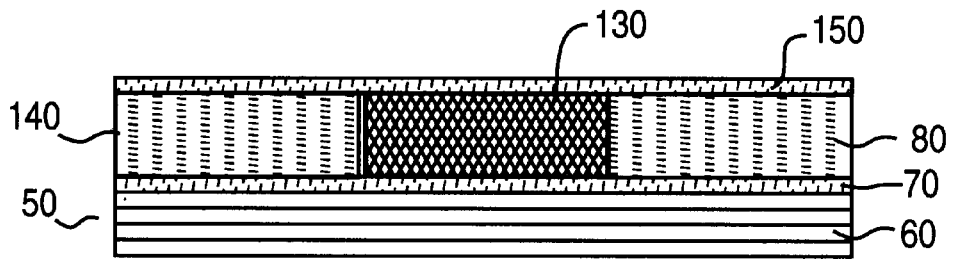
FIG. 7 represents a cross-sectional view of the mask substrate of FIG. 6 after the mask surface has been optionally capped.

FIG. 7 represents a cross-sectional view of the step following planarization of absorber material 130, which is to cap the mask. A layer of capping material 150 that is substantially transmissive to the wavelength of light to be used is deposited onto top surface 140 of structure layer 80. Capping material 150 itself may be any material that is substantially transmissive and is capable of being deposited using physical vapor deposition or chemical vapor deposition or other technique, at a sufficiently low temperature as to not create damage or otherwise modify the underlying layers of material. In the case of EUVL, capping material 150 is preferably a layer of silicon dioxide made sufficiently thin to avoid substantial loss of reflectivity from the reflector, or a layer of silicon which can be at a greater thickness due to its greater transmissivity compared with silicon dioxide. Note that capping material 150 serves as a protector for the mask top surface 140. It is not necessary to have capping material 150 in place for the mask to function.

The invention has been described in terms of an etch stop layer formed over the surface of a mask to create a more controllable etch profile for etching patterns into the material above the etch stop layer. The etch stop layer is selected to have a substantially transmissive characteristic and may need to be formed as a very thin layer in order to be substantially transmissive. The etch stop layer is also selected to serve as an etch stop for the etchable material above the etch stop layer. The etchable material may be a structural material, where trenches are etched and absorber structures are formed within the trenches. Or the etchable material can be the absorber itself, where the absorber is deposited and etched in accordance with known principles.

While the invention has been described in reference to preferred embodiments, it will be appreciated by those of ordinary skill in the art that modification and derivatives of the embodiments can be made without departing from the scope of the invention, which is defined by the claims below.

We claim:

1. A method of fabricating a photolithographic mask, comprising:
    forming a substantially transmissive etch stop layer on a mask substrate;
    forming an etchable material on the etch stop layer; and
    etching a trench into the etchable material.

2. A method of fabricating a photolithographic mask as in claim 1, wherein the etch stop layer comprises silicon dioxide.

3. A method of fabricating a photolithographic mask as in claim 2, wherein the etch stop layer is less than about 5 nanometers thick.

4. A method of fabricating a photolithographic mask as in claim 2, wherein the etchable material is silicon.

5. A method of fabricating a photolithographic mask as in claim 1, further including:
    depositing light absorbing material selected from the group consisting of chromium, titanium, tantalum, tungsten and aluminum into the trench; and
    planarizing the surface of the mask.

6. A method of fabricating a photolithographic mask as in claim 5, further including the step of forming a transmissive capping layer over the planarized top surface of the mask.

7. A method of fabricating a photolithographic mask as in claim 6, wherein the capping layer is selected from the group consisting of silicon dioxide and silicon.

8. A method of fabricating a photolithographic mask as in claim 1, wherein the mask substrate includes a reflective surface.

9. A photolithographic mask structure, comprising:
    a mask substrate;
    a transmissive etch stop layer formed on the mask substrate; and
    a light absorbing material selected from the group consisting of chromium titanium, tantalum, tungsten and aluminum formed on the etch stop layer, the light absorbing material having substantially squared bottom corners.

10. A mask structure as in claim 9, further comprising a planarized mask surface.

11. A mask structure as in claim 10, further comprising a capping layer over the planarized mask surface.

12. A mask structure as in claim 9 further including a reflective surface on the mask substrate.

13. A mask structure as in claim 9, wherein the etch stop layer comprises silicon dioxide.

14. A method of fabricating a photolithographic reflective mask, comprising:
    depositing an etch stop layer on a substrate having a reflective top surface;
    depositing a transmissive layer over the etch stop layer;
    etching a trench into the transmissive layer;
    continuing to etch the transmissive layer to remove residue from the base of the trench and to generate substantially 90-degree corners where the vertical walls of the transmissive layer abut the etch stop layer;
    depositing light absorbing material selected from the group consisting of chromium, titanium, tantalum, tungsten and aluminum in the trench in the transmissive layer; and
    planarizing the top surface of the mask.

15. A method of fabricating a mask as in claim 14, wherein the etch stop layer comprises silicon dioxide.

16. A method of fabricating a mask as in claim 14, wherein the transmissive layer comprises silicon.

17. A method of fabricating a mask as in claim 14, further including the step of forming a transmissive capping layer over the planarized top surface of the mask.

18. A method of fabricating a mask as in claim 17, wherein the capping layer is selected from the group consisting of silicon dioxide and silicon.

* * * * *

UNITED STATES PATENT AND TRADEMARK OFFICE
CERTIFICATE OF CORRECTION

PATENT NO. : 5,958,629
DATED : September 28, 1999
INVENTOR(S) : Yan et al.

It is certified that error appears in the above-identified patent and that said Letters Patent is hereby corrected as shown below:

Column 2,
Line 35, delete "I" and insert -- 1 --.

Signed and Sealed this

Second Day of December, 2003

JAMES E. ROGAN
*Director of the United States Patent and Trademark Office*